United States Patent [19]

Kimura

[11] Patent Number: 5,313,416
[45] Date of Patent: May 17, 1994

[54] SEMICONDUCTOR MEMORY CONTROL DEVICE AND METHOD OF MOUNTING SAME IN HIGH DENSITY

[75] Inventor: Masatoshi Kimura, Itami, Japan

[73] Assignee: Mitsubishi Denki Kabushiki Kaisha, Tokyo, Japan

[21] Appl. No.: 907,041

[22] Filed: Jul. 1, 1992

[30] Foreign Application Priority Data

Jul. 3, 1991 [JP] Japan ............... 3-162547

[51] Int. Cl.⁵ .............. G11C 5/04; G06K 19/07
[52] U.S. Cl. ......................... 365/52; 365/53; 361/749; 439/77
[58] Field of Search ........... 365/51, 52, 53, 63; 439/67, 77; 361/398, 412, 413

[56] References Cited

U.S. PATENT DOCUMENTS

| | | | |
|---|---|---|---|
| 3,766,439 | 10/1973 | Isaacson | 361/398 |
| 4,905,124 | 2/1990 | Banjo et al. | 362/395 |
| 4,994,896 | 2/1991 | Uemura et al. | 257/773 |

FOREIGN PATENT DOCUMENTS 0443717 8/1991 European Pat. Off. .
WO9013989 11/1990 PCT Int'l Appl. .

*Primary Examiner*—Joseph A. Popek
*Attorney, Agent, or Firm*—Leydig Voit & Mayer

[57] ABSTRACT

A semiconductor memory control device includes a flexible circuit board having a plurality of panels and folded so that the panels are stacked on one another, a plurality of semiconductor elements mounted on the flexible circuit board, and a package enclosing the flexible circuit board and the plurality of semiconductor elements. A method of mounting semiconductor memory control devices in high density includes mounting a plurality of semiconductor elements on a flexible circuit board, forming an internally mounted module by folding the flexible circuit board in panels that are stacked in multiple layers, and enclosing the internally mounted module in a package.

24 Claims, 5 Drawing Sheets

SEMICONDUCTOR MEMORY CONTROL DEVICE AND METHOD OF MOUNTING SAME IN HIGH DENSITY

BACKGROUND OF THE INVENTION

1. Field of the Invention

The present invention relates to a semiconductor memory control device and a high-density mounting method therefor. More particularly, the present invention relates to a large-capacity memory control device and to a method of mounting large-capacity memory control devices in high density in a small package.

2. Description of the Related Art

FIG. 11 shows the construction of a conventional semiconductor memory control device. A plurality of semiconductor elements 19 are mounted on both sides of a printed board 18. An electrode 14 of a connector 13 is electrically connected to the printed board 18. A semiconductor memory control device is connected to an external device through this connector 13. In FIG. 11, reference numeral 15 denotes a sheathing frame; and reference numerals 16 and 17 denote an obverse panel and a reverse panel, respectively.

Next, a method of mounting this semiconductor memory control device will be explained. First, semiconductor elements 19 are mounted on both sides of the printed board 18, and the electrode 14 of the connector 13 is soldered to the printed board 18. Thus, an internally mounted module is formed, and is thereafter placed inside the sheathing frame 15. The obverse panel 16 and the reverse panel 17 are mounted on the sheathing frame 15. Thus, mounting of the semiconductor memory control device is completed.

In the conventional semiconductor memory control device, as shown in FIG. 11, there is a limitation on the number of semiconductor elements 19 which can be mounted because they are mounted on one or both sides of one printed board 18. For example, if it is assumed that a maximum of 12 semiconductor elements 19 can be mounted on one side of the printed board 18, the maximum number of semiconductor elements is 24 even if both sides of the printed board 18 are used. Therefore, there is a problem in that it is difficult to make a small semiconductor memory control device with a large capacity.

SUMMARY OF THE INVENTION

The present invention has been accomplished to solve the above-mentioned problem of the prior art.

An object of the present invention is to provide a large-capacity semiconductor memory control device of small size.

Another object of the present invention is to provide a method of mounting large-capacity semiconductor memory control devices in high density in small packages.

The semiconductor memory control device in accordance with the present invention comprises a flexible circuit board folded in such a manner that panels of the board are stacked on one another in multiple layers; a plurality of semiconductor elements mounted on the flexible board; and a package enclosing the flexible board and the plurality of semiconductor elements.

A method of mounting semiconductor memory control devices in high density in accordance with the present invention comprises the steps of mounting a plurality of semiconductor elements on a flexible circuit board; forming an internally mounted module by folding panels of the flexible board stacked multiple layers; and enclosing the internally mounted module in a package.

In the semiconductor memory control device of the present invention, the folding of the flexible board to form a stack of layers makes possible multi-stage mounting of a plurality of semiconductor elements.

In the high-density mounting method for semiconductor memory control devices of the present invention, a multistage mounting of a plurality of semiconductor elements is performed by folding the flexible board along edges of panels of the board in such a manner that the panels are stacked in multiple layers.

DESCRIPTION OF THE PREFERRED EMBODIMENTS

Preferred embodiments of the present invention will be explained below with reference to the accompanying drawings.

Figure 1:
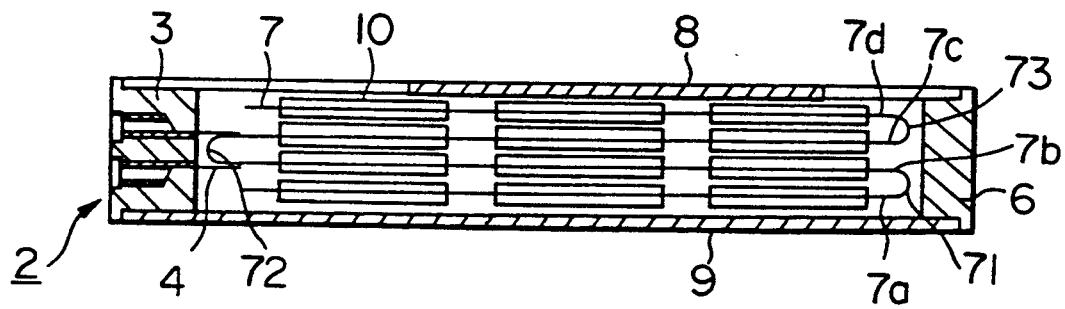
FIG. 1 is a cross-sectional view which illustrates a semiconductor memory control device of a first embodiment of the present invention.

FIG. 1 is a cross-sectional view which illustrates a semiconductor memory control device according to a first embodiment of the present invention. One continuous flexible circuit board 7 is folded at three folding portions 71 to 73 in such a manner that panels of the board are stacked on one another. Thus, first to fourth layers 7a to 7d of the flexible board 7 are formed. A plurality of semiconductor elements 10 are mounted on each of the first to fourth layers 7a to 7d of the flexible circuit board 7. An electrode 4 of a connector 3 is soldered to the second-stage folding portion 72 of the flexible circuit 7. The flexible circuit board 7, the semiconductor elements 10 and the connector 3 constitute an internally mounted module 2. The internally mounted module 2 is placed inside a sheathing frame 6, on which frame an obverse panel 8 and a reverse panel 9 are mounted. The main body of the package includes the sheathing frame 6, the obverse panel 8 and the reverse panel 9.

Figure 2:
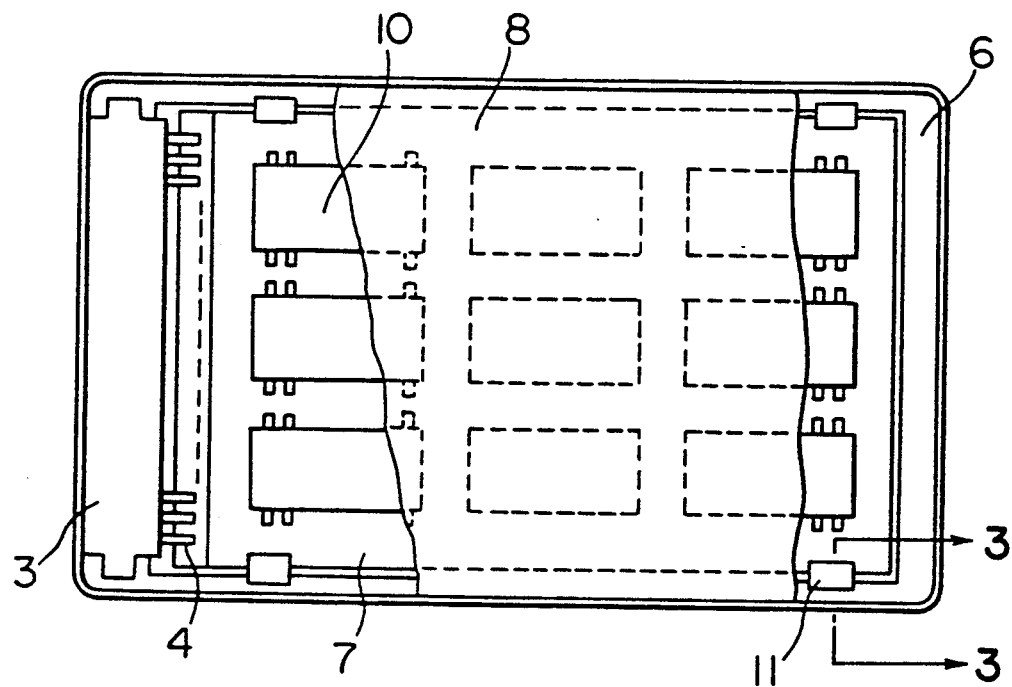
FIG. 2 is a plan view, partly in cross section, which illustrates the semiconductor memory control device of the first embodiment.
Figure 3:
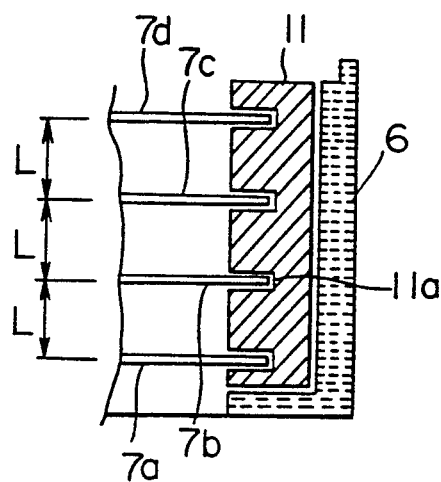
FIG. 3 is a cross-sectional view taken in the direction of the arrows along the line 3—3 of FIG. 2.

As shown in FIG. 2, the flexible board 7 is fixed by a plurality of thickness mold members 11 which are securedly fixed to the sheathing frame 6. A detailed cross section of this thickness mold member 11 is shown in FIG. 3. The thickness mold member 11 has four slits 11a spaced apart from each other by a space L. The edges of each of the layers 7a to 7d of the flexible board 7 is inserted into a corresponding slit 11a. The space between ajacent layers of the flexible board 7 can be kept at a predetermined value L by using the thickness mold member 11. As a result, deformation of each of the layers 7a to 7d can be prevented. The space L is determined by the thickness of the semiconductor elements 10 mounted on the flexible board 7 or other factors.

Figure 4:
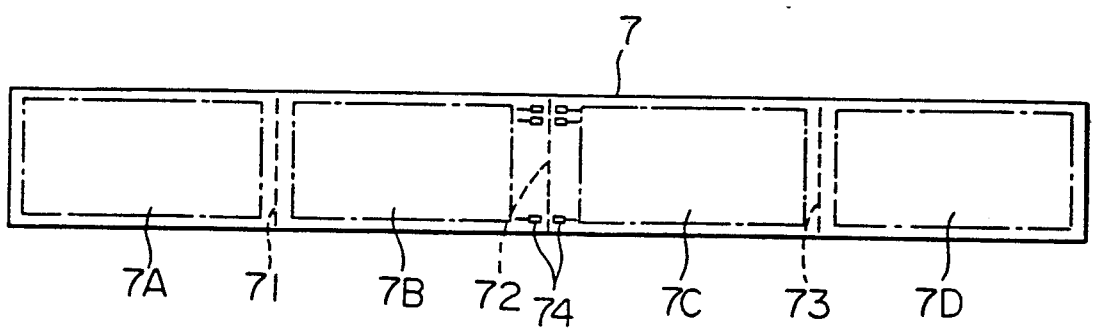
FIG. 4 is a plan view which illustrates a flexible board used in the semiconductor memory control device of the first embodiment.

Next, a method of mounting semiconductor memory control devices according to this embodiment will be explained. First, one continuous flexible circuit board 7 shown in FIG. 4 is prepared. The flexible board 7 has first to fourth panels 7A to 7D having substantially the same size, which become first to fourth layers 7a to 7d, respectively. A first folding region 71 is formed between the first panel region 7A and the second panel 7B; a second folding region 72 is formed between the second panel 7B and the third panel 7C; and a third folding region 73 is formed between the third panel 7C and a fourth panel 7D. An electrode pattern 74, which is soldered to the electrode 4 of the connector 3, is formed in the vicinity of the second folding region 72.

After parts, such as a plurality of semiconductor elements 10, are mounted on both sides of the four panels 7A to 7D of the flexible board 7, the flexible board 7 is folded at the folding portions 71 to 73 in such a way that these panels 7A to 7D are stacked in multiple layers. Furthermore, the electrode pattern 74 formed in the vicinity of the second folding portion 72 is soldered to the electrode 4 of the connector 3. Thus, an internally mounted module 2 is formed. Thereafter, the internally mounted module 2 is placed inside the sheathing frame 6, and the obverse panel 8 and the reverse panel 9 are mounted on the sheathing frame 6. Thus, the mounting of the semiconductor memory control device is completed.

Figure 11:
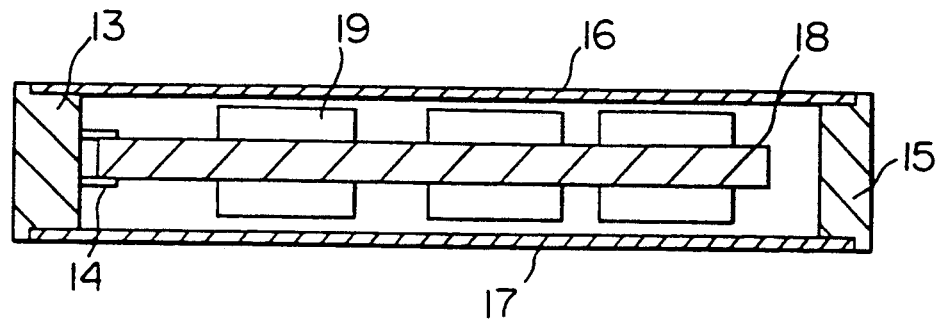
FIG. 11 is a cross-sectional view which illustrates a conventional semiconductor memory control device.

In the semiconductor memory control device mounted as described above, since semiconductor elements 10 are mounted on both sides of the first to fourth layers 7a to 7d of the flexible circuit board 7, high-density mounting, four times that of the conventional semiconductor memory control devices shown in FIG. 11, is made possible.

The obverse surface 8 and the reverse surface 9 may be constructed with one of either an electrically conductive member or an insulating member. In addition, if wiring is formed by printing or the like on the thickness mold member 11, an electrical connection between the layers 7a to 7d of the flexible board 7 can be obtained through the thickness mold member 11.

Figure 5:
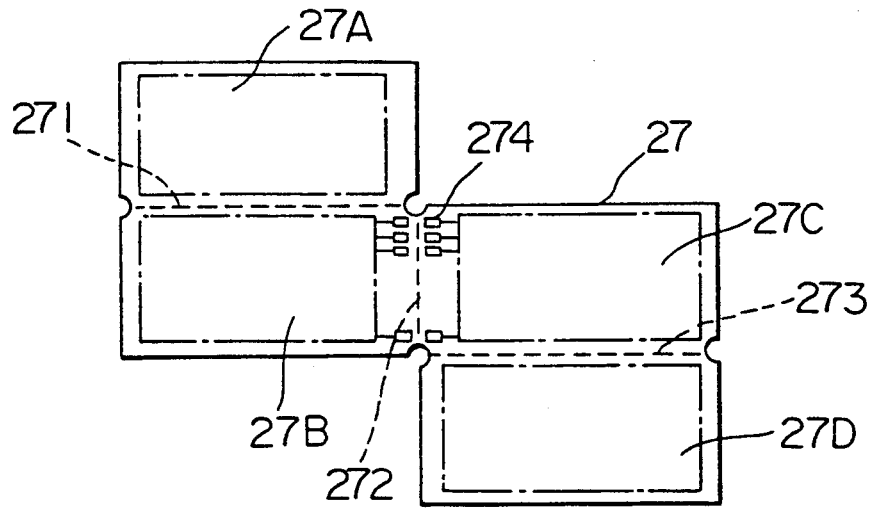
FIG. 5 is a plan view which illustrates a flexible board used in a modification of the first embodiment.

A flexible board 27 shown in FIG. 5 may be used as a flexible board. In the flexible board 27, a first panel 27A and a second panel 27B, both of which are in the shape of a rectangle, are in contact with each other on their long sides. The connection portion between them becomes a first folding portion 271. In like manner, a third panel 27C and a fourth panel 27D, both of which are in the shape of a rectangle, are in contact with each other on their long sides. The connection portion between them becomes a third folding portion 273. The second panel 27B and the third panel 27C are in contact with each other on their short sides. The connection portion between them becomes a second folding portion 272, and an electrode pattern 274 is formed in this portion. Since such a flexible board 27 is used, the length of the wiring from the electrode pattern 274 to each circuit region, and, in particular, to the parts on the first and fourth panels 27A and 27D, is short, and thus electrical characteristics of the semiconductor memory control device can be improved.

Figure 6:
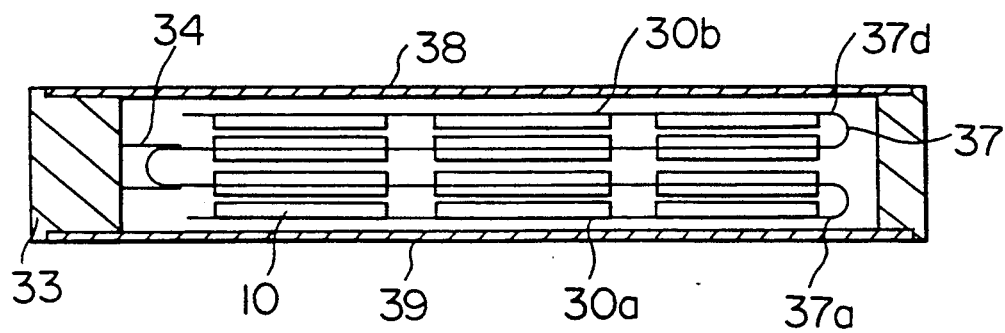
FIG. 6 is a cross-sectional view which illustrates a semiconductor memory control device of a second embodiment of the present invention.

A semiconductor memory control device according to a second embodiment of the present invention is shown in FIG. 6. In this embodiment, semiconductor elements are not mounted on the outside surfaces of the outermost layers 37a and 37d of a flexible board 37 bent in such a manner as to be stacked on one another. The entire surfaces of these surfaces are ground planes 30a and 30b, respectively. The ground planes 30a and 30b become signal ground planes by being electrically connected to a signal ground pin inside an electrode 34 of a connector 33. When a frame ground pin is provided inside the electrode 34, the ground planes 30a and 30b are connected to a frame ground pin, thus these planes can be made frame ground planes. If the ground planes 30a and 30b are provided as in this embodiment, when noise from outside, such as an electrostatic charge, is applied to an obverse panel 38 and a reverse panel 39, the noise is conducted to ground through the signal or frame ground pin. As a result, deterioration/breakdown of the semiconductor elements 10 resulting from external noise can be prevented.

Figure 7:
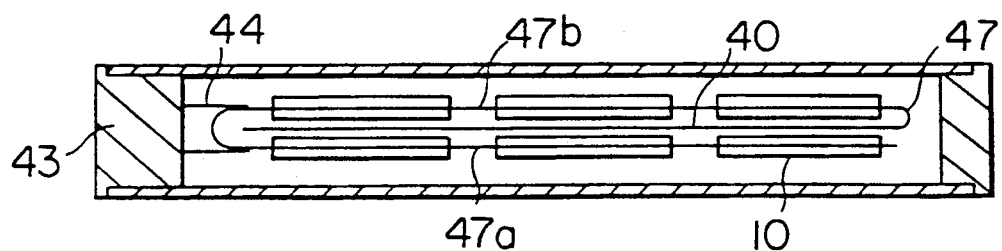
FIG. 7 is a cross-sectional view which illustrates a semiconductor memory control device of a third embodiment of the present invention.
Figure 8:
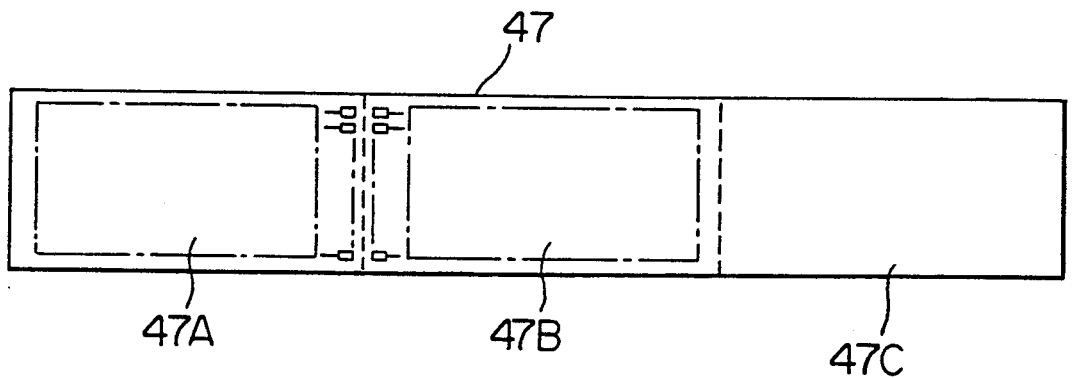
FIG. 8 is a plan view which illustrates a flexible board used in the third embodiment.

A semiconductor memory control device of a third embodiment of the present invention is shown in FIG. 7. In this embodiment, a shield layer 40 formed from a part of the flexible board 47 is inserted between a first layer 47a and a second layer 47b of the flexible board 47 folded in such a manner as to be stacked. The shield layer 40 is electrically connected to a signal ground pin or a frame ground pin inside an electrode 44 of a connector 43. This semiconductor memory control device can be mounted by using one continuous flexible board 47 shown in FIG. 8. The flexible board 47 has first and second panels 47A and 47B, which become the first layer 47a and the second layer 47b, respectively, and a shield layer 47C, which is connected to the second panel 47B and whose entire surface is made into a ground plane. Since the flexible circuit board 47 is folded so that the shield layer 47C is sandwiched between the first panel 47A and the second panel 47B, the shield layer 40 shown in FIG. 7 is formed. According to this embodiment, even if semiconductor elements 10 which operate at high speed are mounted in high density, electromagnetic or electrostatic induction between the semiconductor elements 10 resulting from a high-speed electric current or large electric current can be prevented. As a result, noise can be prevented and thus malfunctions can be prevented also. As a consequence, a highly reliable semiconductor memory control device can be realized.

Figure 9:
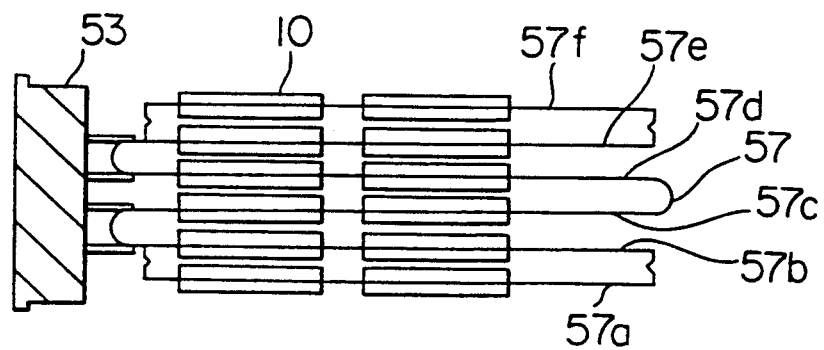
FIG. 9 is a cross-sectional view which illustrates an internally mounted module of a semiconductor memory control device of a fourth embodiment.
Figure 10:
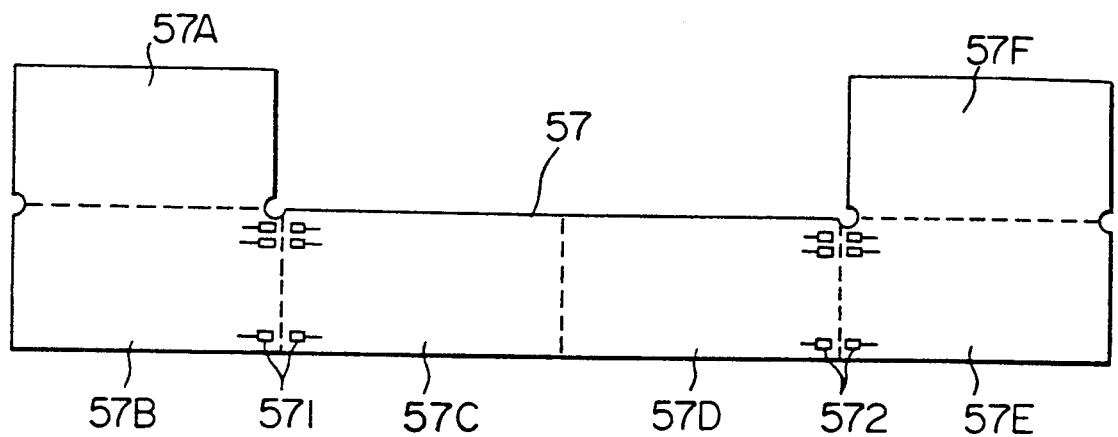
FIG. 10 is a plan view which illustrates a flexible board used in the fourth embodiment.

Although in each of the above-described embodiments a flexible board, which is folded into a maximum of four layers, with a connector having a group of double row electrodes, is shown, the number of the layers of the flexible board is not limited to this number. For example, as shown in FIG. 9, a flexible board 57 is folded in six layers 57a to 57f, and the flexible board 57 may be connected to a connector 53 having a group of electrodes in four rows. A plan view of the flexible board 57 is shown in FIG. 10. The flexible board 57 has first to sixth panels 57A to 57F, which become first to sixth layers 57a to 57f, respectively. A first electrode pattern 571 is formed in the vicinity of a folding portion between the second panel 57B and the third panel 57C. A second electrode pattern 572 is formed in the vicinity of a folding portion between the fourth panel 57D and a fifth panel 57E. Other parts, such as a plurality of semiconductor elements 10, are mounted on both sides of the six panels 57A to 57F of the flexible circuit board 57, the flexible board 57 is folded, and further, the first and second electrode patterns 571 to 572 are soldered to a group of electrodes of the connector 53 in four rows. Thus, an internally mounted module shown in FIG. 9 is formed.

What is claimed is:

1. A semiconductor memory control device comprising:
   a flexible circuit board folded to form layers of panels stacked relative to one another;
   a plurality of semiconductor elements mounted on the flexible circuit board; and
   a package body enclosing the flexible circuit board and the plurality of semiconductor elements and including a sheathing frame having grooves engaging edges of the panels of the flexible circuit board.

2. The semiconductor memory control device according to claim 1 comprising a connector connected to portions of the flexible circuit board, the plurality of semiconductor elements being electrically connected to the connector.

3. The semiconductor memory control device according to claim 2 wherein the connector includes two rows of electrodes.

4. The semiconductor memory control device according to claim 2 wherein the connector includes four rows of electrodes.

5. The semiconductor memory control device according to claim 1 wherein each of the panels of the flexible circuit board has substantially the same size.

6. The semiconductor memory control device according to claim 1 wherein each of the panels of the flexible circuit board is rectangular, and each of the panels is connected to another panel along short sides of the respective rectangular panels.

7. The semiconductor memory control device according to claim 1 wherein each of the panels of the flexible circuit board is rectangular, and at least one panel is connected to an adjacent panel along long sides of the respective rectangular panels.

8. A semiconductor memory control device comprising:
   a flexible circuit board folded to form layers of panels stacked relative to one another wherein an outermost panel of the folded flexible circuit board is free of semiconductor elements and is a ground plane;
   a plurality of semiconductor elements mounted on the flexible circuit board; and
   a package body enclosing the flexible circuit board and the plurality of semiconductor elements.

9. The semiconductor memory control device according to claim 8 wherein the package comprises a sheathing frame including grooves engaging edges of the panels of the flexible circuit board having a plurality of semiconductor elements mounted thereon and obverse and reverse panels mounted on the sheathing frame.

10. The semiconductor memory control device according to claim 8 comprising a connector connected to portions of the flexible circuit board, the plurality of semiconductor elements being electrically connected to the connector.

11. The semiconductor memory control device according to claim 4 wherein each of the panels of the flexible circuit board has substantially the same size.

12. The semiconductor memory control device according to claim 8 wherein each of the panels of the flexible circuit board is rectangular, and each of the panels is connected to another panel along short sides of the respective rectangular panels.

13. The semiconductor memory control device according to claim 8 wherein each of the panels of the flexible circuit board is rectangular, and at least one panel is connected to an adjacent panel along long sides of the respective rectangular panels.

14. A semiconductor memory control device comprising:
   a flexible circuit board folded to form layers of panels stacked relative to one another wherein at least one panel of the flexible circuit board is free of semiconductor elements and is a shield disposed between two other panels of the flexible circuit board on which semiconductor elements are mounted for shielding the semiconductor elements on the two panels from each other;
   a plurality of semiconductor elements mounted on the flexible circuit board; and
   a package body enclosing the flexible circuit board and the plurality of semiconductor elements.

15. The semiconductor memory control device according to claim 14 comprising a connector connected to portions of the flexible circuit board, the plurality of semiconductor elements being electrically connected to the connector.

16. The semiconductor memory control device according to claim 14 wherein each of the panels of the flexible circuit board has substantially the same size.

17. The semiconductor memory control device according to claim 14 wherein the packaged comprises a sheathing frame including grooves engaging edges of the panels of the flexible circuit board having a plurality of semiconductor elements mounted thereon and obverse and reverse panels mounted on the sheathing frame.

18. The semiconductor memory control device according to claim 14 wherein each of the panels of the flexible circuit board si rectangular, and each of the panels is connected to another panel along short sides of the respective rectangular panels.

19. The semiconductor memory control device according to claim 14 wherein each of the panels of the flexible circuit board is rectangular, and at least one panel is connected to an adjacent panel along long sides of the respective rectangular panels.

20. A method of mounting semiconductor memory control devices in high density comprising:
   mounting a plurality of semiconductor elements on a flexible circuit board including a plurality of panels;
   forming an internally mounted module by folding the flexible circuit board to form multiple panels stacked relative to one another; and enclosing the internally mounted module in a package comprising a sheathing frame having grooves including inserting edges of the flexible circuit board having a plurality of semiconductor elements mounted thereon in the grooves.

21. The mounting method according to claim 20 wherein the flexible circuit board is folded so that all of the panels have substantially the same size.

22. The mounting method according to claim 20 wherein an outermost panel of the flexible circuit board is a ground plane.

23. The mounting method according to claim 20 wherein shield layers for shielding semiconductor elements are formed on some panels of the flexible circuit board.

24. The mounting method according to claim 20 wherein the flexible circuit board includes a plurality of rectangular panels and at least one panel is connected to an adjacent panel along long sides of the respective rectangular panels including folding the flexible circuit board along the long sides of the rectangular panels connected along those long sides.

* * * * *